(12) United States Patent
Ionescu

(10) Patent No.: US 6,693,973 B2
(45) Date of Patent: Feb. 17, 2004

(54) APPARATUS, AND ASSOCIATED METHOD, FOR FORMING A SYSTEMATIC, RECURSIVE, SPACE-TIME CODE

(75) Inventor: Dumitru Mihai Ionescu, Dallas, TX (US)

(73) Assignee: Nokia Corporation, Espoo (FI)

( * ) Notice: Subject to any disclaimer, the term of this patent is extended or adjusted under 35 U.S.C. 154(b) by 196 days.

(21) Appl. No.: 09/982,379

(22) Filed: Oct. 17, 2001

(65) Prior Publication Data

US 2003/0072386 A1 Apr. 17, 2003

(51) Int. Cl.$^7$ ................................. H04L 27/20
(52) U.S. Cl. ................. 375/295; 375/267; 375/299; 714/755
(58) Field of Search ................. 375/260, 267, 375/275, 278, 284, 285, 295, 296, 299; 714/752, 755; 455/59, 60, 61, 63, 65; 370/204

(56) References Cited

U.S. PATENT DOCUMENTS

| | | |
|---|---|---|
| 6,115,427 A | 9/2000 | Calderbank et al. |
| 6,166,667 A | 12/2000 | Park |
| 6,317,411 B1 * | 11/2001 | Whinnett et al. ............ 370/204 |
| 6,351,499 B1 * | 2/2002 | Paulraj et al. ............... 375/267 |
| 6,584,593 B1 * | 6/2003 | Seshadri et al. ............ 714/752 |

FOREIGN PATENT DOCUMENTS

WO    WO 00/14921    3/2000

* cited by examiner

Primary Examiner—Chieh M. Fan
(74) Attorney, Agent, or Firm—Federico Fraccaroli

(57) ABSTRACT

Apparatus, and an associated method, for encoding digital data to be communicated by a sending station, such as a base transceiver station of a cellular communication system. Space-time diversity is provided pursuant to the encoding, thereby to facilitate communication of data upon communication channels susceptible to fading conditions. Systematic and recursive encoders are configured to permit concatenation of multiple encoded data in such a way as to comply with an equal eigenvalue condition.

19 Claims, 3 Drawing Sheets

| $i = 0$ | | $q$ | | $i = 8$ | | $q$ | | $i = 16$ | | $q$ | | $i = 24$ | | $q$ | |
|---|---|---|---|---|---|---|---|---|---|---|---|---|---|---|---|
| ...7 | | 8 | 16 | ...15 | | 8 | 16 | ...23 | | 8 | 16 | ...31 | | 8 | 16 |
| $\begin{bmatrix}13\\00\end{bmatrix}$ | | $C_0$ 00 | $C_0$ 0 | $\begin{bmatrix}33\\02\end{bmatrix}$ | | $C_0$ 01 | $C_2$ 1 | $\begin{bmatrix}31\\00\end{bmatrix}$ | | $C_5$ 00 | $C_8$ 0 | $\begin{bmatrix}11\\02\end{bmatrix}$ | | $C_5$ 01 | $C_{10}$ 1 |
| $\begin{bmatrix}12\\10\end{bmatrix}$ | | $C_1$ 00 | $C_1$ 0 | $\begin{bmatrix}32\\12\end{bmatrix}$ | | $C_1$ 01 | $C_3$ 1 | $\begin{bmatrix}30\\10\end{bmatrix}$ | | $C_4$ 00 | $C_9$ 0 | $\begin{bmatrix}10\\12\end{bmatrix}$ | | $C_4$ 01 | $C_{11}$ 1 |
| $\begin{bmatrix}11\\20\end{bmatrix}$ | | $C_0$ 10 | $C_2$ 0 | $\begin{bmatrix}31\\22\end{bmatrix}$ | | $C_0$ 11 | $C_0$ 1 | $\begin{bmatrix}33\\20\end{bmatrix}$ | | $C_5$ 10 | $C_{10}$ 0 | $\begin{bmatrix}13\\22\end{bmatrix}$ | | $C_5$ 11 | $C_8$ 1 |
| $\begin{bmatrix}10\\30\end{bmatrix}$ | | $C_1$ 10 | $C_3$ 0 | $\begin{bmatrix}30\\32\end{bmatrix}$ | | $C_1$ 11 | $C_1$ 1 | $\begin{bmatrix}32\\30\end{bmatrix}$ | | $C_4$ 10 | $C_{11}$ 0 | $\begin{bmatrix}12\\32\end{bmatrix}$ | | $C_4$ 11 | $C_9$ 1 |
| $\begin{bmatrix}03\\01\end{bmatrix}$ | | $C_3$ 00 | $C_5$ 0 | $\begin{bmatrix}23\\03\end{bmatrix}$ | | $C_3$ 01 | $C_7$ 1 | $\begin{bmatrix}21\\01\end{bmatrix}$ | | $C_6$ 00 | $C_{13}$ 0 | $\begin{bmatrix}01\\03\end{bmatrix}$ | | $C_6$ 01 | $C_{15}$ 1 |
| $\begin{bmatrix}02\\11\end{bmatrix}$ | | $C_2$ 00 | $C_4$ 0 | $\begin{bmatrix}22\\13\end{bmatrix}$ | | $C_2$ 01 | $C_6$ 1 | $\begin{bmatrix}20\\11\end{bmatrix}$ | | $C_7$ 00 | $C_{12}$ 0 | $\begin{bmatrix}00\\13\end{bmatrix}$ | | $C_7$ 01 | $C_{14}$ 1 |
| $\begin{bmatrix}01\\21\end{bmatrix}$ | | $C_3$ 10 | $C_7$ 0 | $\begin{bmatrix}21\\23\end{bmatrix}$ | | $C_3$ 11 | $C_5$ 1 | $\begin{bmatrix}23\\21\end{bmatrix}$ | | $C_6$ 10 | $C_{15}$ 0 | $\begin{bmatrix}03\\23\end{bmatrix}$ | | $C_6$ 11 | $C_{13}$ 1 |
| $\begin{bmatrix}00\\31\end{bmatrix}$ | | $C_2$ 10 | $C_6$ 0 | $\begin{bmatrix}20\\33\end{bmatrix}$ | | $C_2$ 11 | $C_4$ 1 | $\begin{bmatrix}22\\31\end{bmatrix}$ | | $C_7$ 10 | $C_{14}$ 0 | $\begin{bmatrix}02\\33\end{bmatrix}$ | | $C_7$ 11 | $C_{12}$ 1 |

FIG. 4

APPARATUS, AND ASSOCIATED METHOD, FOR FORMING A SYSTEMATIC, RECURSIVE, SPACE-TIME CODE

The present invention relates generally to a manner by which to facilitate communication of data upon a communication channel susceptible to fading, such as a communication channel used during operation of a cellular, or other, radio communication system. More particularly, the present invention relates to apparatus, and an associated method, by which to encode data to form a concatenation of systematic, recursive, space-time codes that complies with an equal eigenvalue criterion. Concatenation of the codes is performable, and the codewords from the concatenated encoder are applied to a multiple-antenna set to be transduced into electromagnetic form for communication upon the communication channel.

BACKGROUND OF THE INVENTION

Communication of data between remotely-positioned sending and receiving stations is a necessary adjunct of modern society. A wide variety of different types of communication systems have been developed and are regularly utilized to effectuate communication of data between the sending and receiving stations.

Advancements in communication technologies have permitted the development, and commercial implementation, of new types of communication systems. Radio communication systems are exemplary of communication systems which have benefitted from the advancements in communication technologies. Improvements to existing types of radio communication systems as well as new types of radio communication systems have been made possible as a result of the advancements in communication technologies.

Use of a radio communication system inherently permits increased communication mobility in contrast to use of a conventional wire line communication system. Communication channels defined between sending and receiving stations of a radio communication system are defined upon radio links formed therebetween. The communication channels are referred to as radio channels and do not require fixed connections for their formation.

The advancements in communication technologies include, for instance, the use of digital communication techniques. The use of digital communication techniques permits the communication capacity of a communication system to be increased as well as also to improve the quality levels of communications effectuated in the communication system.

Information which is to be communicated in a digital communication system is digitized. Once digitized, the digitized information is formatted, such as into data packets, and converted into a form to permit its communication upon the communication channel. In an ideal communication system, the data packets, subsequent to transmission upon the communication channel and reception at a receiving station, are substantially identical in value to the corresponding data packets prior to their communication upon the communication channel. In an actual communication system, however, distortion is introduced upon the data during its communication upon the communication channel such that the values of the data, when received at the receiving station, differ, in part, from corresponding values of the data packets prior to its communication upon the communication channel. If the amount of distortion is significant, the informational content of the data cannot accurately be recovered at the receiving station.

Multipath transmission, for instance, causes fading of the data. Such fading might alter the values of the symbols of a data packet during its transmission upon the communication channel. Quasi static flat fading, for example, models a situation in which fading is flat in frequency and is constant during duration of a relevant block of transmitted signals. In contrast, fast flat fading models a situation in which fading is flat in frequency but changes as fast as from a block of (transmitted) complex symbol epochs to a subsequent block of complex symbol epochs; here a block consists of at least one epoch. If the propagation distortion is not properly corrected, resultant communication quality levels of the communications are, at a minimum, reduced.

Various techniques are utilized to compensate for the distortion introduced upon the data as a result of communication of the data upon a non-ideal communication channel. Increasing the diversity of the data is utilized, for instance, to increase the likelihood that the informational content of the data can be recovered.

Encoding of the data, prior to its communication, by creating redundancy in time can be viewed as time diversity. When the data is encoded, the redundancy of the data is increased. Because of the increased redundancy, loss of portions of the data due to fading is less likely to prevent the recovery of the informational content of the data.

Space diversity at the transmitter end is also utilized to compensate for distortion. Typically, transmit space diversity refers to the utilization of more than one transmit antenna at a sending station at which to transduce the data. The antenna transducers are separated by distances great enough to ensure that the data communicated from the respective transducers fade in an uncorrelated manner. Fading of the data transmitted upon one communication path to a receiving station is thereby less likely to fade in the same manner and at the same time as data communicated to a receiving station upon a different communication path.

Space and time diversity are sometimes utilized together, thereby further to enhance transmission diversity to combat signal fading caused, e.g., by multi path transmission.

Various coding techniques have been developed for use in transmit diversity schemes. Space-time codes have been developed to achieve diversity when transmitted upon fading channels by implementing redundancy at a sending station in both space and time. Traditional systematic and recursive codes are known. Systematic and recursive codes are advantageous in concatenating at least two codes, to form so-called 'turbo' codes, which are to be decoded iteratively. However, systematic and recursive, space-time codes have generally not been available. Additionally, an equal eigenvalue condition can be imparted on at least those pairs of codewords separated by the smallest symbol Hamming distance, in order to benefit a concatenation of codes. This feature, along with the apparatus and associated method, constitutes the object of this invention.

It is in light of this background information related to communication of data upon a channel susceptible to fading that the significant improvements of the present invention have evolved.

SUMMARY OF THE INVENTION

The present invention, accordingly, advantageously provides apparatus, and an associated method, by which to facilitate communication of data upon a communication channel susceptible to fading, such as a radio communication channel used during operation of a cellular, or other, communication system.

Through operation of an embodiment of the present invention, data is encoded to form codewords that are generated, e.g., via parallel-concatenated space-time encoders, possibly with puncturing. The constituent encoders pertain to systematic, recursive, space-time codes. And, the codewords resulting from the concatenated encoders are applied to a multiple antenna set to be transduced therefrom.

In one aspect of the present invention, apparatus is provided for a sending station, operable to send a communication signal representative of data that is to be communicated to a receiving station. At the sending station, the data that is to be communicated is encoded by individual, constituent space-time encoders, which are chosen to form a concatenation scheme and perform, e.g., trellis encoding of the data according to the constituent space-time codes representative of some choice of coded representations of data, which form the concatenation. A constituent encoder's implementation includes a feedback path, and the encoder is constructed such that the codeword formed thereat is both systematic and recursive. The codeword has characteristics to facilitate communication upon communication channels having multiple propagation paths that result in fading.

In another aspect of the present invention, separate constituent space-time encoders are coupled to receive indications of the same data. That is to say, data that is applied to a first space-time encoder is also applied to a second space-time encoder. The data applied to the second space-time encoder is interleaved prior to application thereto. Each of the space-time encoders encodes the data applied thereto to form codewords at the outputs of the respective encoders. The codewords formed by the respective encoders are concatenated together in a meaningful way, e.g., in parallel to form parallel-concatenated codewords, perhaps with puncturing of some parts of their respective outputs. The parallel-concatenated codewords are applied to an antenna transducer set to be transduced therefrom. Space-time diversity provided to the data to be communicated by a sending station to a receiving station facilitates communication of the data to a receiving station in a form that permits the informational content of the data, once received at the receiving station, to be recreated. Because the space-time codes formed by the respective constituent space-time encoders are both systematic and recursive, the concatenation of the respective codes formed via the respective space-time encoders is lucrative.

In one implementation, a systematic, recursive, eight-state, constituent space-time encoder is used. In another implementation, a systematic, recursive, sixteen-state, space-time encoder is used. The space-time encoder is implemented, for instance, at a base transceiver station of a cellular, or other radio, communication system. When data to be communicated, such as data packets formed pursuant to effectuation of a packet-based communication service, recovery of the informational content of the data packets at a mobile station that receives the data packet is facilitated.

In these and other aspects, therefore, apparatus, and an associated method, is provided for a sending station operable in a communication system to send data upon a communication channel susceptible to fading. Channel-encoded data is formed. A first encoder is coupled to receive first values representative of the data to be communicated upon the communication channel. The first encoder translates the first values representative of the data into first encoded form. The first encoded form is used to construct a first codeword. The first codeword is of a systematic, recursive space-time code that complies with an equal eigenvalue criterion. A second encoder is coupled to receive second values representative of the data to be communicated upon the communication channel. The second encoder translates the second values into second encoded form. The second encoded form is used to construct a second codeword of a systematic, recursive space-time code that also complies with equal eigenvalue criterion. At least selected parts of both the first and second codewords form the channel-encoded data, so as to verify an equal eigenvalue condition for at least those pairs of codewords separated by the smallest symbol Hamming distance.

A more complete appreciation of the present invention and the scope thereof can be obtained from the accompanying drawings which are briefly summarized below, the following detailed description of the presently preferred embodiments of the invention, and the appended claims.

BRIEF DESCRIPTION OF THE DRAWINGS

FIG. 4 illustrates a table listing thirty-two matrices having entries representative of points of a 4-PSK (phase shift keying) constellation sent during operation of an embodiment of the present invention.

DETAILED DESCRIPTION

Figure 1:
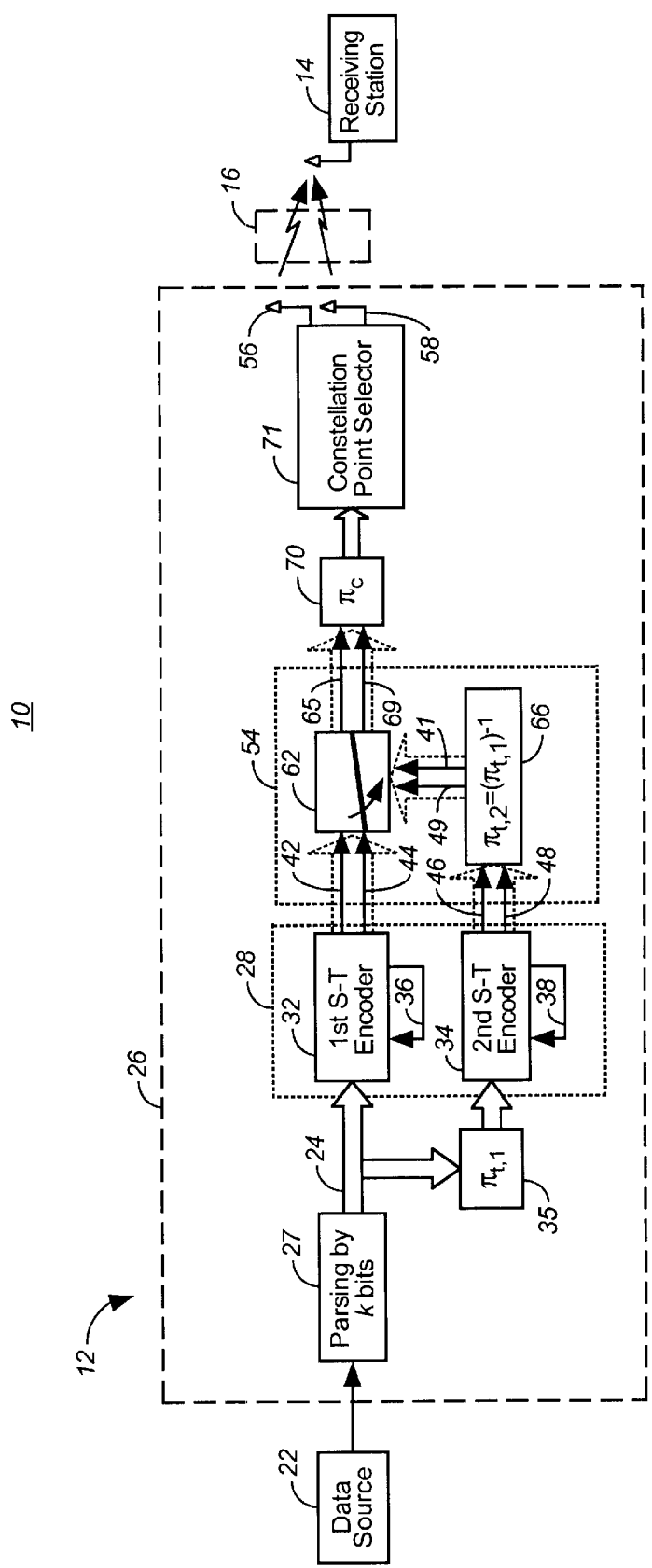
FIG. 1 illustrates a functional block diagram of a communication system in which an embodiment of the present invention is operable.

Referring first to FIG. 1, a communication system, shown generally at 10, is operable to communicate data between a sending station 12 and a receiving station 14 by way of a communication channel 16. The communication channel is susceptible to fading in manners that interfere with communication of the data between the sending and receiving stations.

In the exemplary implementation shown in the figure, the communication system 10, forms a communication system in which the sending station 12 forms a base transceiver station (BTS) of the cellular communication system, and the receiving station 14 forms a mobile station operable in the cellular communication system. While the following description shall describe operation of the communication system with respect to the exemplary implementation thereof as a cellular communication system, it should be understood that operation of an embodiment of the present invention is analogously also operable in any communication system to facilitate communication of data between a sending and a receiving station upon a communication channel which is susceptible to fading, or other distortion.

Here, data to be communicated by the sending station to the receiving station is sourced at a data source 22. The data source is representative of any data-type which is to be communicated by the sending station. Data generated by the data source comprises, for instance, data packets communicated pursuant to a GPRS (General Packet Radio Service) implemented in a GSM (Global System for Mobile Communications) cellular communication system.

Data sourced at the data source 22 is parsed in blocks of at least one bit by parser 27, then supplied one block at a time on the line 24 which is provided to an encoder part 28 of an embodiment of the present invention. The encoder part 28 is here formed of a first space-time encoder 32 and a second space-time encoder 34. Data sourced at the data source 22 is applied directly to the first encoder 32 and is applied to the second encoder 34 by way of an interleaver 35. The interleaver 35 is operable to interleave selected portions of the data provided thereto and to apply the data, once interleaved, to the second encoder 34.

The implementation of the first encoder includes a feedback path 36 used during operation of the encoder to provide the recursive feature. The second encoder analogously includes a feedback path 38 used during encoding operations of the second encoder, also to provide a recursive feature.

The first encoder is operable to generate a systematic, recursive, space-time codeword on the output lines 42 and 44. And, the second encoder 34 is analogously operable to generate a systematic, recursive, space-time codeword on the output lines 46 and 48. The codewords comply with an equal eigenvalue condition.

The first and second encoders 32 and 34 are positioned to permit parallel-concatenation theretogether, in a meaningful form, of the codes formed by the respective encoders. Here, the codewords are selectably applied to a parallel-concatenator 54 which is positioned between the encoder part, on one hand, and, on another hand, a set of antenna transducers 56 and 58, a constellation point selector 71, and possibly a channel interleaver 70. The parallel-concatenator includes a switch element 62. The switch element is coupled to receive portions of the codewords generated by the encoders 32 and 34. The portions of the codewords generated by the second encoder 34 are, possibly, first de-interleaved by a de-interleaver 66. When the deinterleaver 66 is present, the switch element may simply connect one of the lines 44 and 49 with with line 69, and line 42 may be directly coupled by the parallel concatenator to line 65. The role of the channel interleaver 70, when present, is to break the channel fading memory. The constellation point selector maps the concatenated space-time codeword to the individual antenna transducers.

In the exemplary implementation, systematic symbol values forming part of the codeword formed by the encoder 32 are generated on the lines 42. Parity bits formed by the same encoder are generated on the line 44. The parity bits are derived from values of the data provided to the encoder on the line 24. And, the values generated on the lines 42 are untransformed versions of the parsed blocks (possibly permutated internally) of data applied to the first encoder. Analogously, symbol values generated on the lines 46 are parity values derived from the interleaved data applied to the second encoder. And, the symbol values generated on the lines 48 are systematic symbols, namely untransformed, but permutated, versions of the blocks applied to the second encoder. In the presence of the deinterleaver 66, the systematic values 48 appear after deinereaving on line 41, and the parity symbols 46 appear, after deinterleaving, on line 49. Because of the parallel-concatenation of the first and second encoders, the systematic symbol values present on the lines 42 and 41 are redundant with one another and only one of the line-sets are coupled to line 65, which carries the systematic symbols. In effect, the lines 42 are directly coupled to the channel interleaver 70, when present, or to antena transducer 56 via the constellation point selector. In another implementation, the lines 41, instead, could be coupled directly to the channel interleaver 70, when present, or to antena transducer 56 via the constellation point selector.

Because of the formation of a systematic, recursive, space-time code, the coded signal can be applied to suitably spaced apart antenna transducers, here the antenna transducers 56 and 58, to be transduced therefrom upon substantially uncorrelated communication paths to the receiving station. Once received at the receiving station, the informational content of the signal is more likely to be recoverable.

Figure 2:
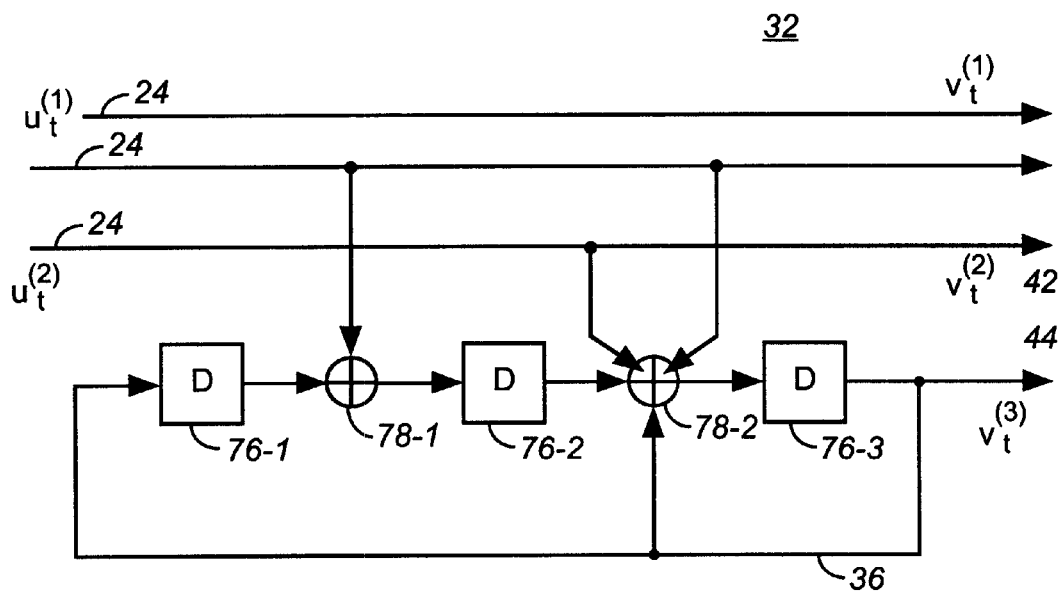
FIG. 2 illustrates a functional block diagram of a systematic, recursive, implementation of an eight-state, space-time encoder of an embodiment of the present invention.

FIG. 2 illustrates an implementation of the encoder 32 of an embodiment of the present invention, here an eight-state, space-time coder. The encoder shown in the figure is also representative of the encoder 34, when implemented as an eight-state, space-time encoder. Here, data to be encoded is provided to the encoder on the lines 24. The encoder includes three delay elements 76-1, 76-2, and 76-3, arranged in a series connection. The left-most (as shown) and the center (as shown) delay elements 76-1 and 76-2 are separated by a summing element 78-1. The summing element 78-1 is coupled to receive input values taken from a middle-positioned (as shown) of the lines 24 and the left-most (as shown) delay element 76-1. The first summed value is provided to the center delay element 76-2. An additional summing element 78-2 is positioned between the delay elements 76-2 and 76-3. The summing element is additionally coupled to receive values generated on the lines 24 and also a branch taken from the recursive path 36. Coded symbol values are formed on the lines 42 and 44 which together define the systematic, recursive space-time code generated by the encoder.

Figure 3:
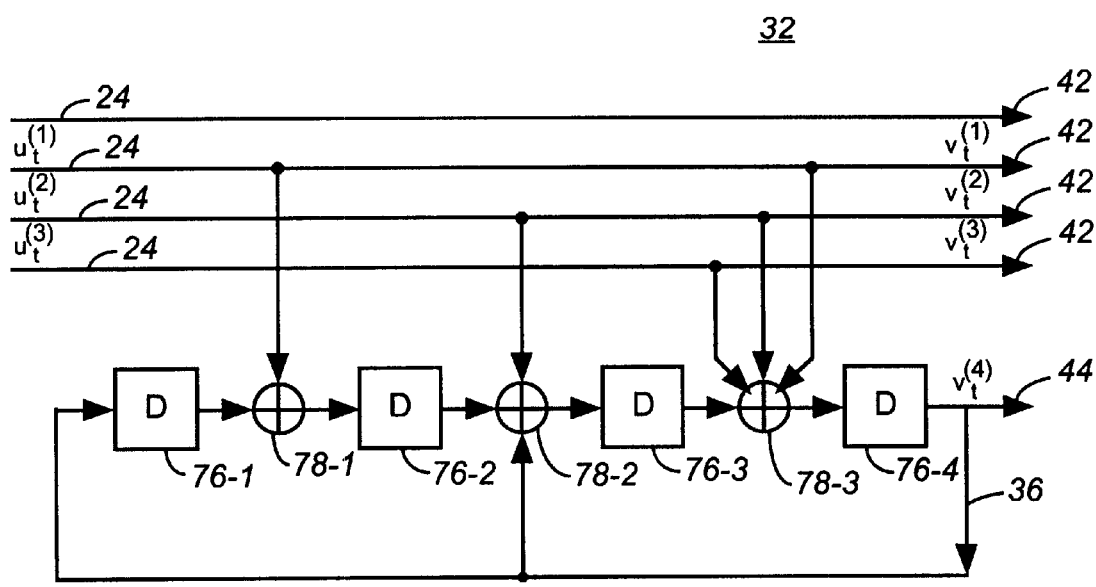
FIG. 3 illustrates a functional block diagram of a systematic, recursive, sixteen-state, space-time encoder of another embodiment of the present invention.

FIG. 3 illustrates the encoder 32 of another implementation. Here, the encoder forms a sixteen-state, space-time encoder. The lines 24 upon which the data sourced by the data source (shown in FIG. 1) is applied to the encoder by way of the lines 24. Four delay elements, elements 76-1, 76-2, 76-3, and 76-4, are here positioned in series connections. And, the recursive path 36 is here shown to extend between the delay element 76-4 and the delay element 76-1.

Three summing elements 78-1, 78-2, and 78-3, are positioned between successive ones of the delay elements. The delay elements 78-1 and 78-2 are further coupled to separate ones of the lines 24, and the summing element 78-2 is further coupled to the recursive path 36. And, the summing element 78-3 is coupled to several of the lines 24. The systematic, recursive space-time code formed by the encoder is provided on the lines 42 and 44. Here, four lines 42 are utilized to permit the generation of a sixteen-state code.

Space-time coding performed by the encoders 32 and 34 of an embodiment provide a means for achieving diversity in fading channels by implementing both space and time redundancy at the transmitter. While space-time coding implies, in general, encoding both across time and across space, the encoders are here capable of constructing good trellis space-time codes in the setting when all transmit antennas use the same M-PSK complex modulator constellation M of unit average energy, and exactly $\log_2 M$ bits are transmitted during each multiple channel use, i.e. coding redundancy is distributed in space. Extensions of the construction discussed herein to non-M-PSK constellations are natural.

Consider a system with L transmit antennas and N receive antennas, designed so that fading across antennas be uncorrelated. In the exemplary implementation shown in the figure, two antenna transducers 56 and 58 are positioned at the sending station. Let l be the number of symbol epochs— with respect to an arbitrary transmit antenna-required to send a codeword. If l is regarded as the number of adjacent symbol epochs processed, to some extent, together at the decoder, then a codeword is the concatenation of all symbols sent over all of the L antennas during the corresponding l consecutive symbol epochs; e.g., a generic codeword c starting at discrete time instant k is $$c = [\, c_k^{(1)} \; c_k^{(2)} \; \cdots \; c_k^{(L)} \; c_{k+1}^{(1)} \; \cdots \; c_{k+1}^{(L)} \; \cdots \; c_{k+l-1}^{(1)} \; \cdots \; c_{k+l-1}^{(L)} \,]^T,$$
$$= [\, c_k^T \; \cdots \; c_{k+l-1}^T \,]^T$$

where $c_k^{(i)}$ is a complex symbol from M, transmitted at discrete time instant k over transmit antena i. A more meaningful representation for the codeword c is code matrix.

$$D_{c,k} = \begin{bmatrix} c_k^{(1)} & \cdots & c_k^{(L)} \\ \vdots & \ddots & \vdots \\ c_{k+l-1}^{(1)} & \cdots & c_{k+l-1}^{(L)} \end{bmatrix}$$

For two codewords, c, e, let the code difference matrix be $D_{ec}=D_e-D_c$. The equal eigenvalue condition (criterion) states that in independent identicaly distributed L-transmit antenna Rayleigh fading an upper bound to the pairwise error probability is made as small as possible if and only if, for all pairs $D_c$, $D_e$, the Euclidean squared distances $tr(D_{ec}{}^H D_{ec})$ are made as large as posible, and the non-square matrices $D_{ec}$ are semi-unitary—up to appropriate proportionality factors—i.e. $D_{ec}{}^H D_{ec}=(tr(D_{ec}{}^H D_{ec})/L)I_L$. This results in the eigenvalues of $D_{ec}{}^H D_{ec}$ being equal, hence the name of the aforementioned condition. For suboptimal codes, the main diagonal elements of the matrices $D_{ec}{}^H D_{ec}$ should be as close as possible to $tr(D_{ec}{}^H D_{ec})/L$, and the row-wise sum of the absolute values of the elements off the main diagonal should be negligible with respect to the corresponding main diagonal element. Finally it is desirable to enforce the equal eigenvalue condition to at least those codematrix pairs that are separated by the least symbol Hamming distance, or correspond to the shortest error event paths through a trellis used to describe the code.

Essentially, for any pair c, e, one should enlarge the Euclidean distance between c, e while rendering the eigenvalues of the square matrix $D\dagger_{ec}D_e$ to be equal, or as close as possible; the latter is equivalent to $D\dagger_{ec}D_e$ being as close to a diagonal matrix as possible. Necessarily, diversity is maximized in quasi static fading (rank of $D\dagger_{ec}D_e$ is L). The proportionality of $tr(D\dagger_{ec}D_e)$ to the Euclidean distance between c and e is crucial for identifying a constellation partitioning that is characteristic of trellis coded modulation schemes.

In order to enforce the desirable equal singular value (ESV) structure to valid l×L matrices $D_{ec}$ is sufficient to enforce it on submatrices. Suppose that L divides l. Let $D_c$, $D_e$, $D_{ec}$ be viewed as block vectors, i.e. (l/L)×1 matrices whose entries are L×L sub-matrices with elements from M. Then any code matrix can be regarded as a sequence of l/L, L×L square sub-matrices, resulting from the unfolding of a trellis whose branches span, each, L modulator symbol epochs, with each branch labeled by a valid L×L sub-matrix,. A path through the trellis is selected as a function of the current state and a block of new input symbols. The set of all L×L matrix building blocks can be regarded as a superconstellation. If these constituent blocks have the property that the Gram matrix of any valid pairwise differences is optimal—or close to optimal—then the properties mentioned above are transferred from $D_c$, $D_e$, $D_{ec}$. For L=2 and 4PSK, the 16 orthogonal complex matrices discussed in the existing art do have the aforementioned ESV structured for their pairwise differences. However, in order to achieve the desired $log_2 M$ b/s/Hz one must have enough L×L constituent matrices in the super-constellation; this requires augmenting the optimal matrix set e.g., by a reflection of itself, to the effect that some code matrix pairs in the augmented set will not obey the ESV structure. The design goal is to ensure that different code matrices pertaining to an error event path (EEP) of length k≦k' transitions (kL modulator symbols) be optimal for k' as large as possible, and as close to optimal as feasible for k>k'. Note that Alamouti's transmit diversity scheme for L=2 transmit antennas can be used by simply appending, to any encoder's output, a mapper from encoded symbols to constellation points, followed by a Hurwitz-Radon transformer applied to two consecutive complex symbols. This provides only diversity gain and is not the approach taken herein. It is worth realizing that the Alamouti scheme with 4PSK and two transmit antennae over additive white Gaussian noise (AWGN) has the same bit error probability as uncoded 4 PSK in AWGN. In subsequent plots, Allmouth's scheme serves as a full diversity, no coding gain, reference.

Consider the L=2 case and assume that each transmit antenna uses 4PSK modulation; other M-PSK constellations can be accommodated using similar steps. A trellis coded modulation scheme with q states, where each trellis transition covers two symbols, can be obtained naturally by constructing a super-constellation whose points are 2×2 matrices chosen so as to facilitate the existence of the structure discussed above; the matrix elements are from 4PSK constellation and there must be enough super-constellation points to allow the transmission of 2 bits per channel use. FIG. 4 illustrates a table listing thirty-two matrices having entries representative of points of a 4-PSK (phase shift keying) constellation. Thirty-two matrices $C_i$ defines the 4PSK symbols to be sent over the L=2 transmit antennae, during two consecutive symbol epochs. The squared Euclidean distance between $C_i$ and $C_j$ is $tr[(C_i-C_j)+(C_i-C_j)]$. The super-constellation will be partitioned in the usual way producing, as a function of q. The elements within on coset are distinguished by means of uncoded bits. Finally, the convolutional code selecting the cosets is described in terms of a matrix G, similar structure with the matrices used to describe the convolutional STCs. Comments on parallel transition follow. The following are true: the minimum Euclidean distance between any two branches leaving (arriving into) a given state is maximized. $D^{554}{}_{ec}D_{ec}$ has equal eigenvalues for any $D_{ec}$ corresponding to EEPs of length k≦2 (i.e., up to four 4PSK symbols). And, the symbol Hamming distance between any two parallel transitions is 2, thereby the diversity is 2 in rapid fading.

The previous descriptions are of preferred examples for implementing the invention, and the scope of the invention should not necessarily be limited by this description. The scope of the present invention is defined by the following claims.

What is claimed:

1. In a sending station operable in a communication system to send data upon a communication channel susceptible to fading, an improvement of apparatus for forming channel-encoded data, said apparatus comprising:
    a first encoder coupled to receive first values representative of the data to be communicated upon the communication channel, said first encoder for translating the first values representative of the data into first encoded form, wherein the first encoded form is used to construct a first codeword of a systematic, recursive space-time code that complies with an equal eigenvalue criterion; and
    a second encoder also coupled to receive second values representative of the data to be communicated upon the communication channel, said second encoder for translating the second values representative of the data into second encoded form, wherein the second encoded form is used to construct a second codeword of a systematic, recursive space-time code that also complies with the equal eigenvalue criterion, wherein at least a selected part of the first codeword and a selected part of the second codeword are used to form the channel-encoded data.

2. The apparatus of claim 1 further comprising an interleaver coupled to receive the first values representative of the data, said interleaver for interleaving the first values to form the second values representative of the data.

3. The apparatus of claim 2 wherein said first encoder and said second encoder are in parallel concatenation with one another, the channel-encoded data formed by a collection of at least part of the first codeword and the second codeword.

4. The apparatus of claim 3 further comprising a de-interleaver coupled to said second encoder to receive the second codeword, said de-interleaver for de-interleaving the second codeword, the channel-encoded data constructed, in part, from the second codeword, once de-interleaved.

5. The apparatus of claim 4 wherein the first codeword constructed through operation of said first encoder comprises at least a first systematic symbol generated on at least a first systematic symbol line and a first parity symbol generated on a first parity line, wherein the second codeword constructed through operation of said second encoder comprises at least a second systematic symbol generated on at least a second systematic symbol line and a second parity symbol generated on at least a second parity line.

6. The apparatus of claim 5 further comprising concatenator connection element coupled to a selected one of the first parity line and the second parity line.

7. The apparatus of claim 1 wherein said first encoder comprises a first systematic recursive encoder including a feedback formed therein.

8. The apparatus of claim 1 wherein the first codeword constructed through operation of said first encoder includes untransformed values of the first values representative of the data.

9. The apparatus of claim 1 wherein the first codeword constructed through operation of said first encoder includes redundant values, the redundant values derived from the first values representative of the data.

10. The apparatus of claim 1 wherein the second codeword constructed through operation of said second encoder includes permutated values of the first values representative of the data.

11. The apparatus of claim 1 wherein the second codeword constructed through operation of said second encoder includes redundant values, the redundant values derived from the second values representative of the data.

12. The apparatus of claim 1 wherein the second codeword constructed through operation of said second encoder includes at least one systematic symbol value and at least one redundant value.

13. The apparatus of claim 1 wherein the first codeword constructed through operation of said first encoder includes at least one systematic symbol value and at least one redundant value.

14. The apparatus of claim 1 wherein the communication system comprises a radio communication system, wherein the sending station comprises a fixed-site transceiver, and wherein the first codeword constructed through operation of said first encoder is communicated by the fixed site transceiver upon a radio channel that forms the communication channel.

15. In a method for communicating in a communication system by which to send data by a sending upon a communication channel susceptible to fading, an improvement of a method for forming channel-encoded data, said method for forming channel-encodes data comprising the operations of translating first values representative of the data into first encoded form, the first encoded form used to construct a first codeword of a systematic, recursive, space-time code that complies with an equal eigenvalue criterion;

translating second values representative of the data into second encoded form, the second encoded form used to construct a second codeword of a systematic, recursive, space-time code that also complies with the equal eigenvalue criterion; and concatenating together at least a selected part of the first codeword and a selected part of the second codeword, thereby to facilitate formation of the channel-encoded data.

16. The method of claim 15 further comprising an operation of interleaving the first values, the first values, once interleaved, forming the second values.

17. The method of claim 16 further comprising an operation of de-interleaving the second codeword constructed during said operation of translating the second values.

18. The method of claim 17 wherein the second codeword, parallel-concatenated together with the first codeword during said operation of concatenating is de-interleaved during said operation of de-interleaving prior to concatenation together during said operation of concatenating.

19. The method of claim 15 further comprising an operation of providing the channel-encoded data to a first antenna transducer and to a second antenna transducer to be transduced therefrom.

* * * * *